(12) United States Patent
Loddenkoetter

(10) Patent No.: US 6,802,745 B2
(45) Date of Patent: Oct. 12, 2004

(54) HOUSING FOR ACCOMODATING A POWER SEMICONDUCTOR MODULE AND CONTACT ELEMENT FOR USE IN THE HOUSING

(75) Inventor: Manfred Loddenkoetter, Ibbenbueren (DE)

(73) Assignee: Eupec Europaeische Gesellschaft fuer Leistungshalbleiter mbH & Co. KG, Warstein-Belecke (DE)

( * ) Notice: Subject to any disclaimer, the term of this patent is extended or adjusted under 35 U.S.C. 154(b) by 0 days.

(21) Appl. No.: 10/298,395

(22) Filed: Nov. 18, 2002

(65) Prior Publication Data

US 2003/0077940 A1 Apr. 24, 2003

Related U.S. Application Data

(63) Continuation of application No. PCT/DE01/01847, filed on May 16, 2001.

(30) Foreign Application Priority Data

May 17, 2000 (DE) .......................................... 100 24 377

(51) Int. Cl.[7] .............................................. H01L 23/34
(52) U.S. Cl. ...................................................... 439/709
(58) Field of Search ................................ 439/590, 709, 439/733.1; 257/723, 724, 690, 691, 692, 693

(56) References Cited

U.S. PATENT DOCUMENTS

| | | |
|---|---|---|
| 3,307,077 A | 2/1967 | Bernstein |
| 4,630,174 A | 12/1986 | Kaufman |
| 5,138,521 A | 8/1992 | Watanabe et al. |
| 5,391,919 A | 2/1995 | Torti et al. |
| 5,408,128 A | 4/1995 | Furnival |
| 6,054,765 A | 4/2000 | Eytcheson et al. |
| 6,541,838 B1 * | 4/2003 | Suetsugu et al. ........... 257/500 |

FOREIGN PATENT DOCUMENTS

| | | |
|---|---|---|
| DE | 31 43 339 A1 | 5/1983 |
| DE | 87 01 935.3 U1 | 5/1987 |
| DE | 36 43 288 A1 | 6/1988 |
| DE | 44 30 047 C2 | 3/1995 |
| DE | 196 27 858 A1 | 1/1998 |
| DE | 299 00 370 U1 | 5/1999 |
| DE | 101 256 96 | * 12/2002 |
| EP | 0 150 347 A1 | 8/1985 |
| EP | 0 438 165 A2 | 7/1991 |
| EP | 0 513 410 A1 | 11/1992 |
| EP | 0 884 781 A2 | 12/1998 |
| JP | 3-48453 A | 3/1991 |
| JP | 07 335 801 A | 12/1995 |
| JP | 09 008 191 A | 1/1997 |

* cited by examiner

*Primary Examiner*—Neil Abrams
(74) *Attorney, Agent, or Firm*—Laurence A. Greenberg; Werner H. Stemer; Gregory L. Mayback

(57) ABSTRACT

A housing device that is used to accomodate at least one power semiconductor module has increased flexibility. Areas of the housing which are configured to receive contact elements in a variety of positions are configured such that the contact elements can be disposed and oriented in a plurality of ways when disposed in each position.

29 Claims, 7 Drawing Sheets

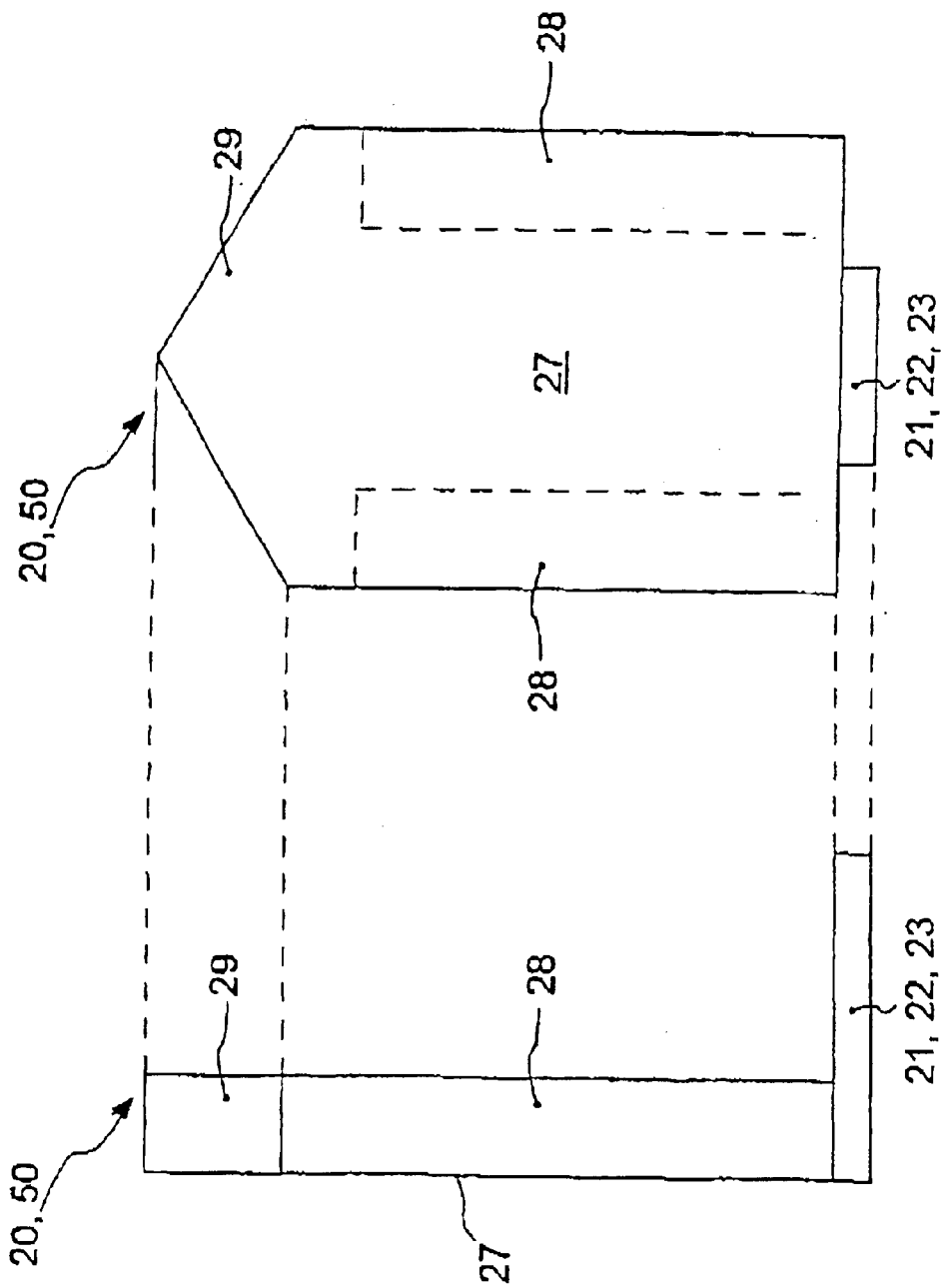

HOUSING FOR ACCOMODATING A POWER SEMICONDUCTOR MODULE AND CONTACT ELEMENT FOR USE IN THE HOUSING

CROSS-REFERENCE TO RELATED APPLICATION

This application is a continuation of copending International Application No. PCT/DE01/01847, filed May 16, 2001, which designated the United States and was not published in English.

BACKGROUND OF THE INVENTION

Field of the Invention

The invention relates to a housing device for accommodating at least one power semiconductor module, and to a contact element for use and/or accommodation in the housing device.

Circuit configurations in which electronic components are connected are frequently accommodated in housings or housing devices to shield the circuit configurations from, for example, undesirable influences. In such a case, plug-in, solder and/or screw contacts are used in the housing device to make specific electrical variables externally available, for example, for the user, and/or to provide electrical connections between adjacent housing areas.

Plug-in frames or other housing areas are normally formed for such a purpose in the housing device, in which so-called pins, insert parts or the like are accommodated in grooves or the like. The electrical connection to the circuit configuration is then produced, for example, through so-called bonding wires.

These conventional housing devices have the problem that the pins or the insert parts are restricted in their use and incorporation into the housing areas. For example, a pin can normally be connected to a housing area only at one end. Furthermore, struts that are used to provide mechanical robustness for the housing and the housing device make electrical connections between different areas more difficult.

Furthermore, the use of conventional sprayed-in or pushed-in contacts leads to natural oscillations between the contact and the housing material during attachment of the bonding wires during the bonding process due to microscopic gaps produced during the production process, which adversely affect the quality of the bond that is to be formed. The same natural oscillation problems occur when using plug-in contacts in a retaining groove.

To solve these problems in the past, bonding wires were laid for flexible connection of circuit areas disposed in different housing areas, which involves additional production complexity and is inconsistent with an automation process because the respective bonds must be provided individually.

To avoid natural oscillations during the formation of the bonds, special apparatuses have been used until now, which minimize the natural oscillations. On the other hand, when using sprayed-in contacts, specific spraying techniques are required to form a particularly good seat during the bonding process, while avoiding natural oscillations. This also involves additional production complexity, resulting in additional costs.

SUMMARY OF THE INVENTION

It is accordingly an object of the invention to provide a housing device and contact element to be used in the housing device that overcome the hereinafore-mentioned disadvantages of the heretofore-known devices of this general type and that produces a particularly flexible and mechanically reliable electrical connection.

With the foregoing and other objects in view, there is provided, in accordance with the invention, a housing device for accommodating at least one power semiconductor module, including housing areas having live contact elements with at least one attachment area, each having a number of contact element configuration positions substantially linear in one extent direction for placing the contact elements in a number of orientations, each being formed from an alternating sequence of apertures and web elements, and each being disposed in approximately one accommodating plane in the extent direction and being substantially mirror-image symmetrical with respect to the accommodating plane, the accommodating plane containing the extent direction, and the web elements each being substantially mirror-image symmetrical, having an approximately double-T-shaped support, and having at least one groove at least one of interlocking and force-fitting the attachment area of the contact elements.

The housing device for accommodating at least one circuit configuration, in particular, a power semiconductor module or the like, has housing areas that are constructed for the configuration of, in particular, live contact elements and that each provide a number of configuration positions for such a purpose.

The housing device according to the invention is characterized in that the housing areas, in particular, with regard to their size and/or shape, are configured such that the contact elements can be disposed in a number of orientations in each of the configuration positions.

A fundamental idea of the present invention is, thus, to configure the housing areas of the housing device that are intended for accommodating the contact elements in terms of their size and shape such that the contact elements that are provided can be disposed in more than one orientation when they are accommodated in the housing areas. This allows the contact elements to be inserted in a more flexible manner in the housing areas.

In accordance with another feature of the invention, the housing areas each are in the form of areas of a plug-in frame, of a strut, of a reinforced area, in the form of an edge or boundary area and/or the like. Such a measure makes it possible to insert the contact elements to be used at a large number of positions in the area of the housing device. In particular, the struts and reinforced regions that are intended to be used for mechanical robustness of the housing device are configured in terms of their size and/or shape such that they are also used for accommodating the contact elements. Thus, in addition to providing mechanical reinforcement, these areas, at the same time, carry out contact-making tasks, thus, further improving the flexibility of the housing device according to the invention.

In accordance with a further feature of the invention, the housing areas are in each case substantially linear, at least in sections and/or locally, at least in one extent direction, and are, preferably, in the form of web, wall or plate elements there. In such a case, it is, furthermore, preferable for the housing areas each to be disposed in approximately one accommodating plane, which contains the respective extent direction, in the extent direction, and, preferably, to be configured to be substantially mirror-image symmetrical with respect to this accommodating plane. These measures result in the housing areas that are intended to accommodate the contact elements having a particularly simple configuration. In particular, the mirror-image symmetry with respect to the accommodating plane means that the number of orientations for the contact elements in the configuration positions can, likewise, be configured to be substantially mirror-image symmetrical with respect to the accommodating plane.

In accordance with an added feature of the invention, the housing areas are each formed substantially from an alternating sequence of apertures and web elements, which are each configured to be substantially the same and/or to have the same effect, in particular, geometrically and/or mechanically. This, then, means that the contact elements can in each case be accommodated in the apertures. If required, the alternating sequence of apertures and web elements maintains the functionality of the mechanical robustness of the housing in principle, to be precise, while at the same time providing flexibility with regard to the accommodation of the contact elements in the large number of apertures. In such a case, the invention, likewise, provides for the configuration positions each to be defined substantially by the position of the apertures or recesses.

Further improved robustness is obtained if the housing areas are each based on a base area that is, preferably, substantially flat or in the form of a plate and is substantially formed in a base plane at right angles to the accommodating plane. Such a configuration means that the housing area has a cross-section substantially in the form of an inverted T, with the base area being formed transversely, for example, on one housing surface, and, thus, giving that housing area sufficient robustness for the configuration in the housing.

The invention, furthermore, provides for a cutout to be formed in each case in the base area, which is configured for interlocking and/or force-fitting accommodation and/or fixing—in particular, by an undersize or a push fit—of one area of a contact element, preferably, of a contact area of it. The provision of the cutouts and of the interlock and/or force fit associated with them ensures particularly reliable mechanical fixing and retention of the contact elements to be accommodated so that natural oscillations, which could detract from the contact formation, are reliably avoided even when forming further contacts, for example, bonds or the like.

Provision is advantageously made as a further attachment measure for the web elements each to have at least one groove, which is configured for interlocking and/or force-fitting accommodation of at least one attachment area of a contact element. This alternatively or additionally results in mechanically reliable retention of a contact element that is to be accommodated. To improve the flexibility, provision is made for the web elements each to be configured to be substantially mirror-image symmetrical, and, preferably, approximately in the form of a double-T support. The grooves so formed in the web areas, thus, form a type of guide rail for insertion and retraction of the contact elements that are to be accommodated.

In accordance with an additional feature of the invention, at least one of the housing areas has a contact device, at least one of the web elements is disposed in the at least one housing area, the contact element has at least one substantially electrically conductive contact area contacting the contact device, the contact device accommodating the contact element and at least one attachment area attaching the contact element to the at least one housing area when the contact element is accommodated in the at least one housing area, and at least one of the contact area and the attachment area being at least partially complementary to the at least one web element to hold the at least one of the contact area and the attachment area in at least one of an interlock and a force-fit when the contact element is accommodated in the at least one housing area and to dispose the contact element in the number of orientations at the configuration position.

A contact element for use and accommodation in a housing device has at least one contact area that is configured to be substantially electrically conductive and to make contact with a contact device for accommodating the contact element in a housing area of the housing device. Furthermore, the contact element has at least one attachment area, which is configured for attachment in a housing area when the contact element is accommodated in a housing area of the housing device.

It is particularly preferable for the contact element, especially as a first contact area of it, to have a substantially planar contact plate, preferably, an insert plate. In such a case, the contact plate can, itself, form the actual contact element as an entity, or can be provided as part thereof. In any case, the provision of such a planar contact plate can be regarded as a particularly simple refinement form of a contact area.

In accordance with yet another feature of the invention, the attachment area is at least one recess in the contact plate.

In accordance with yet a further feature of the invention, the contact plate has an edge and a central area and the recess is formed in at least one of the edge and the central area.

The contact element according to the invention for use and for accommodation in a housing device according to the invention is characterized by choosing the size and/or the shape of the contact area and/or of the attachment area such that the contact element can be disposed in a number of orientations at a configuration position in the housing area of the housing device when the contact element is accommodated in a housing area of the housing device.

One fundamental idea of the contact element according to the invention is, thus, to use the size and shape of the contact element to ensure that the contact element can be disposed in a particularly flexible manner, in a number of orientations at a given configuration position in a housing area of the housing device.

Provision is, advantageously, made for the contact area and/or the attachment area to be configured to be at least partially complementary to an accommodation area that can be provided in the housing area of the housing device, in particular, of a web element, in order to be held in an interlocking and/or force-fitting manner when the contact element is accommodated in the housing area of the housing device. This ensures, in a particularly simple manner, not only the greatest possible flexibility for accommodation of the contact elements, but also that they are reliably mechanically fixed and made contact with, in particular, to prevent natural oscillations during the further contact-making process and during the formation of bonds.

It is further preferable for at least one recess to be formed in the contact plate, especially as a first attachment area. This recess can respectively be provided in an edge area and/or in a central area of the contact plate. The recess is in each case configured such that it engages with a corresponding mating piece of the housing area, preferably, with a corresponding web element, in an at least partially complementary manner, to hold and fix the contact element appropriately when it is accommodated in the housing area of the housing device.

It is particularly advantageous for the contact plate to have a size and/or shape such that it comes to rest at least between areas of two adjacent configuration positions when the contact element is accommodated in a housing area of the housing device and, in the process, substantially surrounds at least one web element of the housing area, in particular, with its recess. In consequence, the corresponding web element substantially passes through the contact element to be accommodated, in a particularly simple manner that is, at the same time, reliable, thus, being fixed and held in an appropriate manner in the housing area.

In accordance with yet an added feature of the invention, the contact plate has a size and/or shape such that it comes to rest between two web elements when the contact element is accommodated in a housing area of the housing device. In such a form, the contact element is effectively clamped in between two adjacent web elements, with the web elements at least partially engaging, in a cooperating manner, with the contour of the recess of the contact plate, which is provided such that it is substantially complementary. This, likewise, results in particularly reliable mechanical retention and fixing of the contact elements to be accommodated in the housing area, while preventing natural oscillations during the bonding process.

It is, furthermore, preferable to provide an area that can be made to engage with a push fit in a housing area when the contact element is accommodated in the housing area of the housing device, in particular, based upon its size and/or shape as the attachment area, in particular, in the area of the contact plate. The provision of a push fit allows the contact element to be mounted in a particularly simple manner in the housing area of the housing device and, furthermore, ensures that it is mechanically held and fixed reliably while avoiding natural oscillations during the bonding process.

In accordance with yet an additional feature of the invention, a substantially electrically conductive tap area, which is configured for tapping off an electrical potential and/or current, is provided as a—possibly further—contact area. Such a measure means that the electrical variables that are required in some circumstances during use are externally accessible in a particularly simple manner through the corresponding tap areas.

In accordance with again another feature of the invention, the attachment area has a size and a shape and engages with the push fit when the contact element is accommodated in the at least one housing area based upon at least one of the size and the shape.

In accordance with again a further feature of the invention, the attachment area is an area of the contact plate.

It is advantageous for the tap area to in each case extend substantially at right angles to any contact plate that may be provided. Because the contact plate is normally substantially planar and is configured to be parallel to a base area of the housing device, the tap areas, then, consequently, extend at right angles to this base area, and the desired electrical variables can, then, be provided in a particularly favorable manner, in particular, to the exterior.

It is, furthermore, preferable that the tap area is substantially in the form of a plate and, preferably, has edge areas that can be made to engage in an interlocking and/or force-fitting manner with grooves of a corresponding web element in a housing area when the contact element is accommodated in the housing area of the housing device. Such a configuration also provides particularly reliable mechanical fixing and retention while avoiding natural oscillations.

Other features that are considered as characteristic for the invention are set forth in the appended claims.

Although the invention is illustrated and described herein as embodied in a housing device and contact element to be used in the housing device, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 5A is a side elevational view of a further embodiment of the contact element according to the invention;

FIG. 5B is a front elevational view of the contact element of FIG. 5A;

DESCRIPTION OF THE PREFERRED EMBODIMENTS

Figures 1, 2:
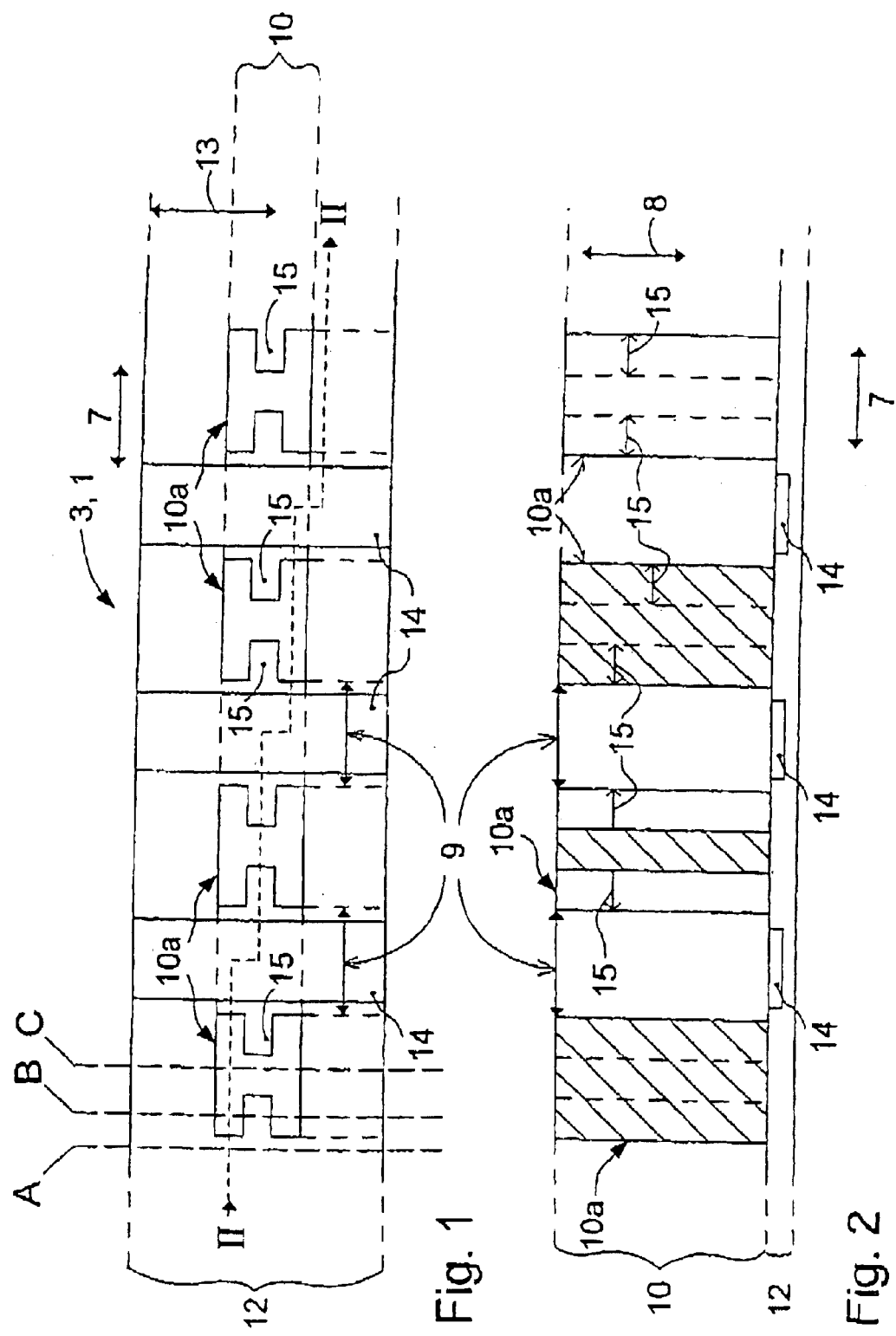
FIG. 1 is a fragmentary, plan view of a housing area of an embodiment of the housing device according to the invention.
FIG. 2 is a partially cross-sectional side view of the housing area of FIG. 1.

Referring now to the figures of the drawings in detail and first, particularly to FIGS. 1 and 2 thereof, there is shown a plan view of one exemplary embodiment of the housing device 1 according to the invention, having a housing area 3 that extends in a first extent direction 7 and is formed by a base area 12, which runs in a first plane 13, and by a web area 10, which is formed on the base area 12 and extends in a second plane 8 at right angles to the first plane 13. The web area 10 is formed by an alternating sequence of web elements 10a and apertures 9 disposed in between them. The web elements 10a and the apertures 9 each have substantially identical geometric shapes. The web elements 10a are substantially in the form of double-T supports and have recesses or grooves 15 running at right angles. Recesses 14 are, likewise, optionally provided in the base area 12 and can be used as the basis for a push fit during insertion of contact elements with a correspondingly complementary configure.

FIG. 2 shows a schematic and partially sectioned side view of the housing area 3 shown in FIG. 1, to be precise along the section line II—II in FIG. 1. As can be seen, the base area 12 substantially forms a narrow planar foot area of the housing area 3. The recesses 14 for the push fit are incorporated in the base area 12. From left to right, four web elements 10a of the web area 10 can be seen, with apertures 9 or recesses disposed therebetween.

The first web element 10a seen from the left is illustrated sectioned on its rear surface. The following one is illustrated sectioned centrally, and the areas of the recesses or grooves 15 can be seen to the right and left of the actual section surface. The next web element 10a in the direction from left to right is illustrated sectioned in the area of its front surface, with the edges of the areas of the grooves 15 being indicated by vertical dashed lines. The web element 10a on the extreme right in FIG. 2 is not sectioned, but is illustrated as a front view, with the areas of the grooves 15, likewise, being indicated as dashed vertical lines.

It can also be seen from FIG. 2 that the web area 10 with its web elements 10a runs in an accommodation direction or accommodating plane 8 at right angles to the extent direction or extent plane 7 of the entire housing area 3.

Figure 3A:
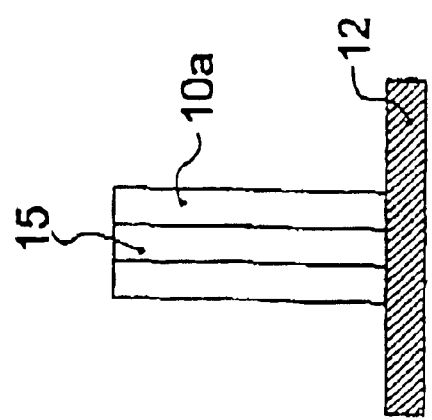
FIGS. 3A to 3C are fragmentary, cross-sectional side views through web elements of the housing area of FIGS. 1 and 2.
Figure 3B:
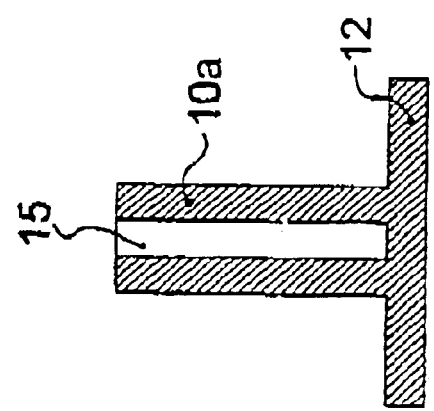
Figure 3C:
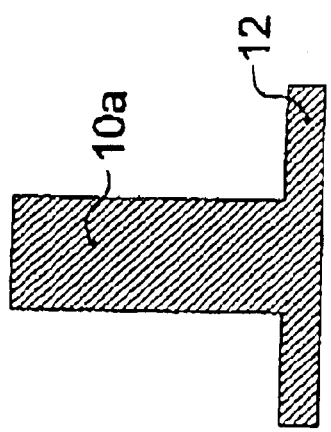

FIGS. 3A, 3B, and 3C show sectioned side views of the web elements 10a used in FIGS. 1 and 2, to be precise along the section planes A, B and C, respectively, which are indicated in FIG. 1.

In FIG. 3A along the section plane A shown in FIG. 1, the web element 10a is illustrated sectioned only in its base area 12. This results in a side view of the actual web element 10a with a groove 15.

In FIG. 3B, the section is both in the base area 12 and in the area of the actual web element 10a, with the side walls of the area of the groove 15 being sectioned, and the rear wall of the groove is being illustrated in the form of a plan view.

Finally, FIG. 3C shows the section along the section plane C from FIG. 1, to be precise, in the central area of the web element 10a.

Figures 4A, 4B:
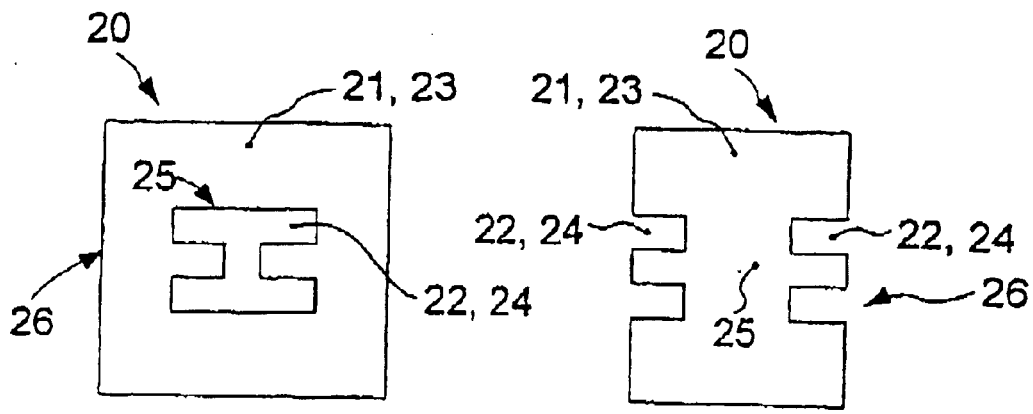
FIGS. 4A to 4C are fragmentary plan views of three different embodiments of the contact element according to the invention.
Figure 4C:
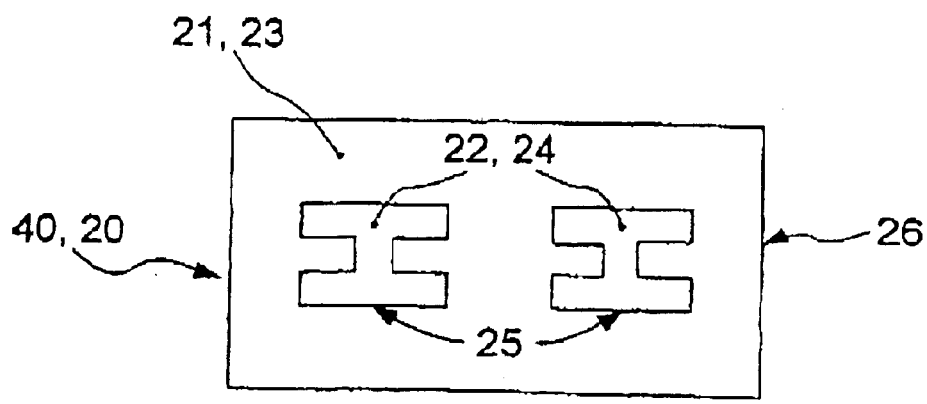

FIGS. 4A to 4C show plan views of three exemplary embodiments of contact elements 20 according to the invention. In use, all of these contact-elements 20 act, in particular, as links or bushings between different areas. The contact elements 20 are each an entity formed as so-called contact plates 23 or insert parts or plates, and are used as contact areas 21. Recesses 24 are in each case provided as attachment areas 22 and, when the contact plates 23 or contact elements 20 are disposed in the housing area 3, are made to engage with the contour of the respective web element 10a in some way.

In the example of the embodiment shown in FIG. 4A, the recess 24 is in the form of an attachment area 22 in a central area 25 of the contact plate 23 or of the contact element 20. The contact element 20 has an approximately rectangular or square base area, whose edge areas 26 are intact.

In contrast thereto, in the exemplary embodiment shown in FIG. 4B, the central area 25 of the contact element 20 or of the contact plate 23 is intact while, in contrast, at the edge areas 26 on opposite edges there are provided corresponding recesses 24 with attachment areas 22.

The embodiment shown in FIG. 4C has two recesses 24 in the central area 25 of the contact element 20, 40 or of the contact plate 23 that is used as a contact area 21, which are used as attachment areas 22 and are, in turn, configured to be approximately complementary to the base area of the web elements 10a shown in FIG. 1 so as to engage with the contour of the web elements 10a when the contact element 20, 40 is in place.

The embodiment shown in FIG. 4A vertically completely surrounds the circumferential edge of a web element 10a when accommodated in a housing area 3, with the areas of two adjacent apertures 9 being at least partially covered at the same time by the contact element 20 in the area of the base 12.

In the exemplary embodiment shown in FIG. 4B, on the other hand, the opposite areas of the grooves 15 of directly adjacent web elements 10a of the housing area 3 are made to engage with the recesses 24 in the contact element 20 when the contact element 20 is in place, with the contact plate 23 coming to rest in the base area 12 between the respective web elements 10a as the contact element 21 of the contact element 20.

The embodiment shown in FIG. 4C acts in a similar way as the embodiment shown in FIG. 4A, but with the grooves 15 of two directly adjacent web elements 10a, of the housing area 3 being made to engage with the two recesses 24 in the contact element 20, 40.

The embodiments shown in FIGS. 4A to 4C have the common feature that they help to bridge the web area 10 of the housing area 3 in the configuration in that electrical connections, in particular, in the form of so-called bonding wires, can be soldered both on the one side of the web area 10 and on the opposite other side of the contact plate 23, on the substantially electrically conductive contact plate 23.

Another embodiment of a contact element 20, 50 according to the invention is illustrated in FIGS. 5A and 5B by a schematic side view and a schematic front view.

The embodiment shown in FIGS. 5A and 5B is that of a so-called contact pin 50. As the contact element 20, this contact pin 50 has a contact plate 23 that is used both as the first, contact area 21 and as the attachment area 22. Firstly, electrical connections can be soldered on the contact plate 23 as the first contact area 21 when the pin 50 is disposed in the housing area 3. Secondly, the contact plate 23 is shaped such that it acts as the attachment area 22, in that, for example, it can be pushed into and held in the recesses 14 (which are shown in FIGS. 1 and 2) in the base area 12, resulting in a type of push fit.

On the other hand, as the contact element 20 according to the invention, the pin 50 has a tap area 27 that extends at right angles to the contact plate 23 and whose thickness is chosen such that at least the edge areas 28 of the tap area 27 can be inserted into a housing area 3 (for example, into the grooves 15 in two adjacent web elements 10a that, for example, are shown in FIGS. 1 and 2) when the pin 50 is disposed as the contact element 20 according to the invention. As such, in addition to forming the push fit, the pin 50 is furthermore fixed by recesses 14 and the first attachment area 21. The edge areas 28 of the tap area 27 are, thus, used as further attachment areas 22. When the pin 50 is used as the contact element 20 according to the invention, the user can, then, tap off appropriate electrical variables on the upper section 29 of the tap area 27, which runs to a point.

Figure 6:
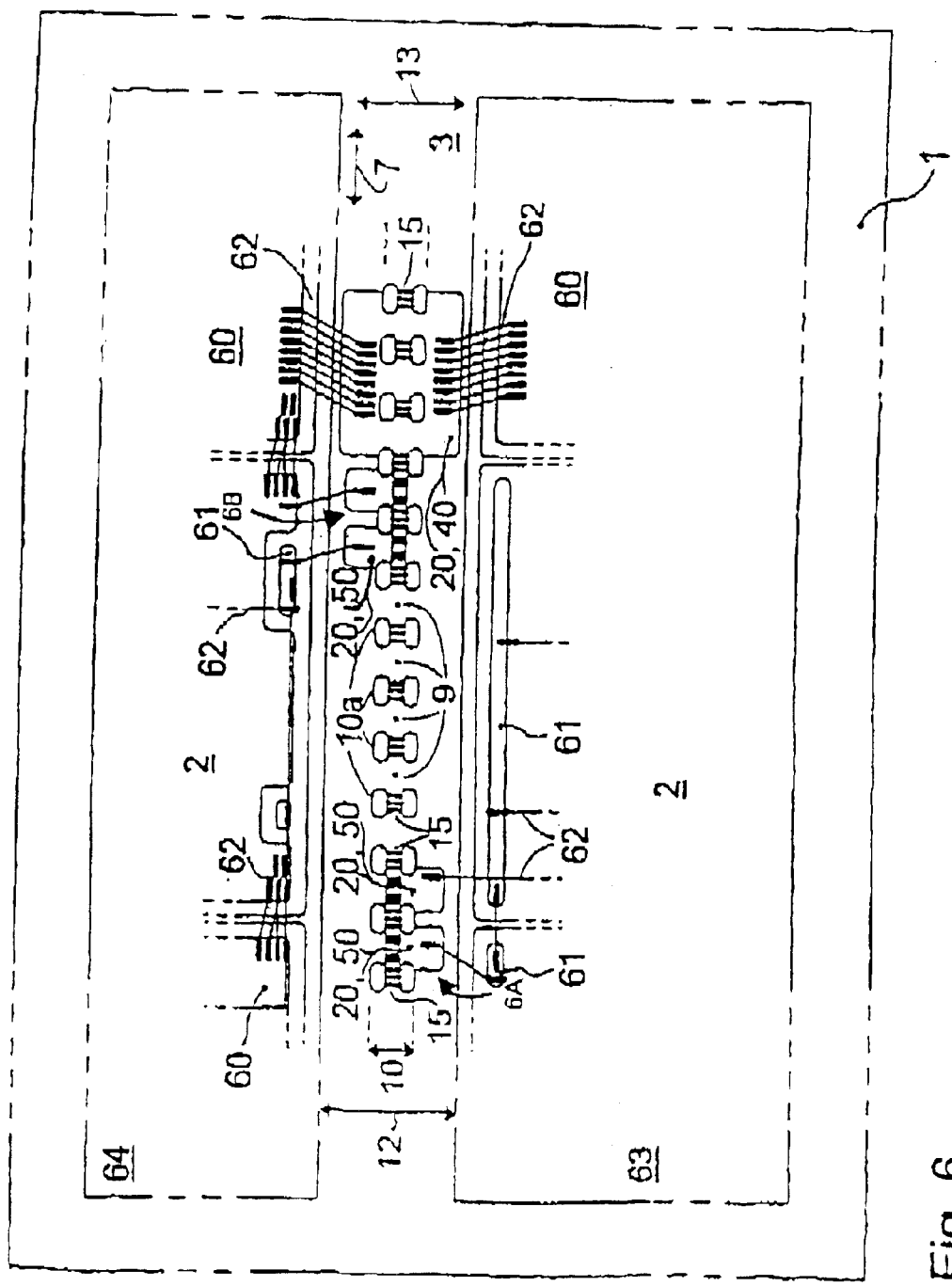
FIG. 6 is a fragmentary, plan view of a circuit configuration with one embodiment of the housing device according to the invention and a corresponding embodiment of contact elements according to the invention.
Figure 7A:
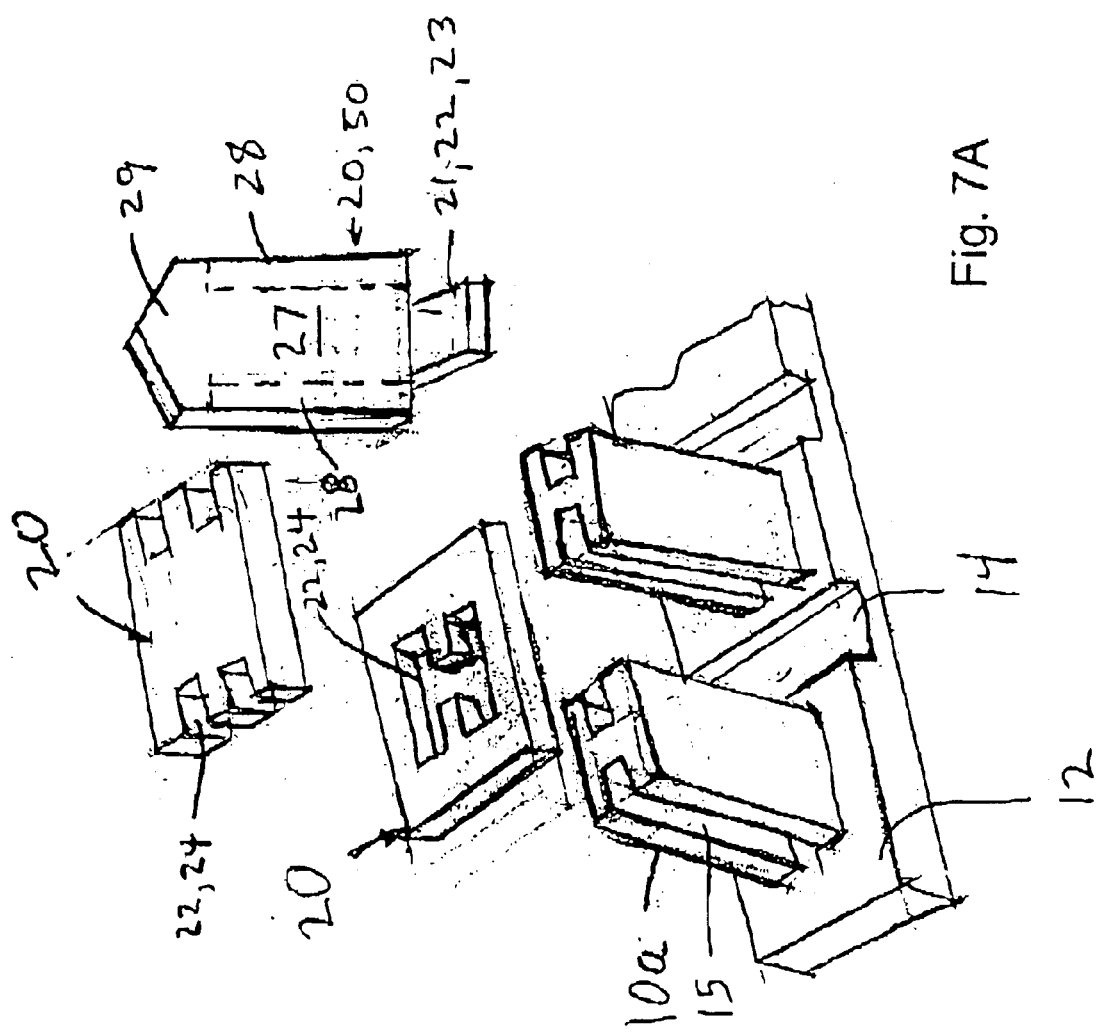
FIGS. 7A and 7B are schematic not-to-scale views of a housing area and selected contact elements before and after assembly.
Figure 7B:
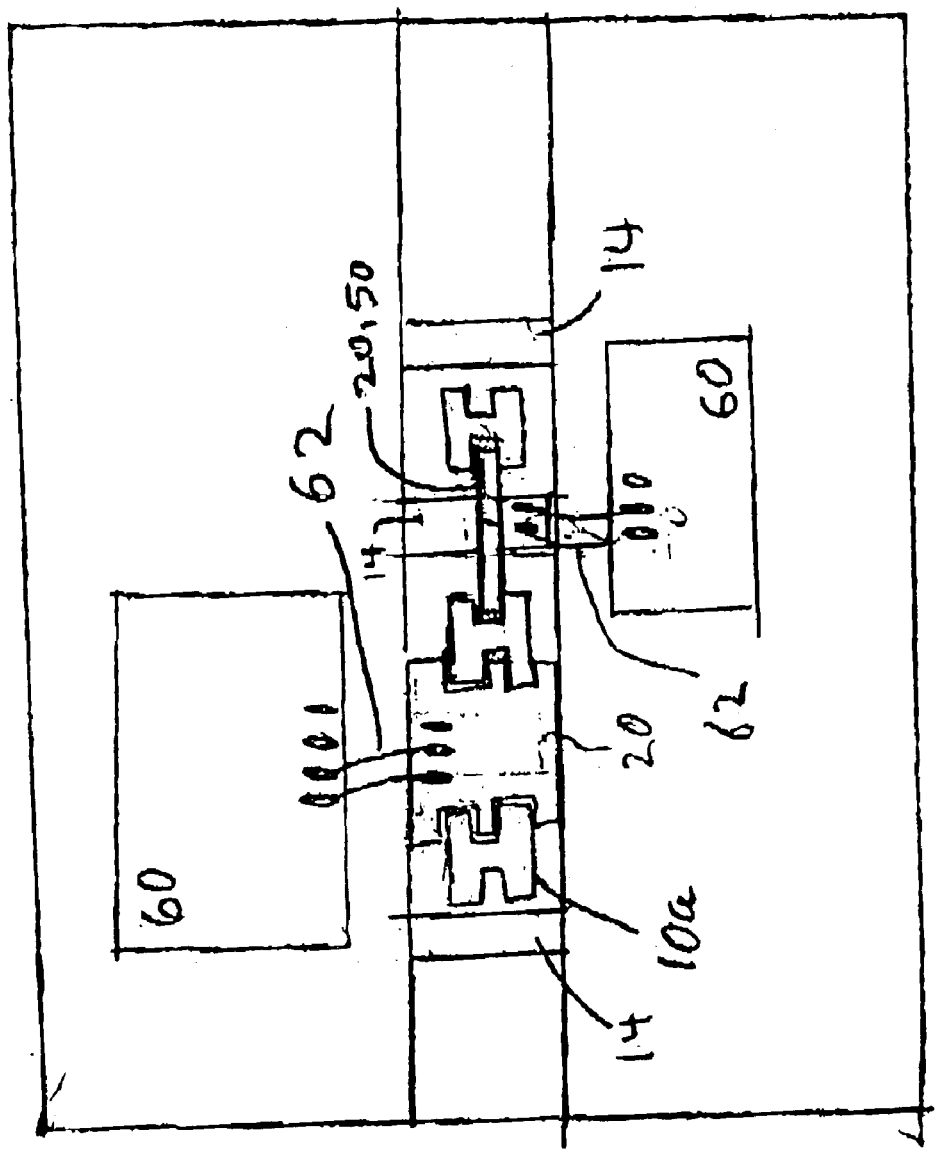

FIG. 6 shows a schematic plan view of the configuration of one embodiment of the housing device 1 according to the invention using contact elements 20, 40, and 50 according to the invention.

The housing device 1 according to the invention has a housing area 3 that is formed substantially by a base area 12 with a web area 10 formed on it. The web area 10 has an alternating sequence of web elements 10a with apertures 9 disposed in between them. The web elements 10a each have one groove 15.

A circuit configuration 2 is accommodated in the housing device 1. This circuit configuration 2 is formed by electrical components 60, by electrical contact areas 61 and by appropriately configured electrical connecting devices 62, in particular, in the form of bonding wires. The circuit configuration 2 is subdivided by the housing area 3 and, in particular, by the web area 10 into a first lower section 63 and a second upper section 64.

An insert element 40, substantially having the shape shown in FIG. 4C, is introduced as the contact element 20 in the right-hand area of the web area 10 to connect the two sections 63 and 64 of the circuit configuration 2 across the separating housing area 3. Appropriate connecting devices 62 in the sections 63 and 64 connect the two sections 63 and 64 of the circuit configuration 2 to one another.

To tap off the electrical variables of the circuit configuration 2 that are provided by the sections 63 and 64, two pins 50 are incorporated in the left-hand area of the web area 10 illustrated in FIG. 6, as the contact element 20 according to the invention in a first orientation 6A in the form shown in FIGS. 5A and 5B, in order to provide electrical variables from the area 63 of the circuit configuration 2. On the other hand, two pins 50 are disposed as the contact elements 20 in the center of the web area 10, in a second orientation 6B in the form shown in FIGS. 5A and 5B to make it possible to tap off electrical variables in the area 64 of the circuit configuration 2.

I claim:

1. A housing device for accommodating at least one power semiconductor module, comprising:
   housing areas:
   having live contact elements with at least one attachment area;
   each having a number of contact element configuration positions substantially linear in an extent direction for placing said contact elements in a number of orientations;
   each being formed from an alternating sequence of apertures and web elements; and
   each being disposed in said extent direction in approximately an accommodating plane containing said extent direction and being
   substantially mirror-image symmetrical with respect to said accommodating plane; and
   said web elements each:
   being substantially mirror-image symmetrical with respect to said accommodating plane;
   having an approximately double-T-shaped support form; and
   having at least one groove for at least one of interlocking and force-fitting said attachment area of said contact elements.

2. The housing device according to claim 1, wherein said housing areas are each formed as areas of a group consisting of a plug-in frame, a strut, a reinforcement, an edge area, and a boundary area.

3. The housing device according to claim 1, wherein said housing areas are each formed as a web at least one of in sections and locally.

4. The housing device according to claim 1, wherein said housing areas are each formed as a wall element at least one of in sections and locally.

5. The housing device according to claim 1, wherein at least one of said apertures and said web elements are each formed at least one of geometrically and mechanically substantially the same and/or each have the same effect.

6. The housing device according to claim 1, wherein at least one of said apertures and said web elements are each formed at least one of geometrically and mechanically substantialy the same.

7. The housing device according to claim 1, wherein positions of said apertures respectively substantially define said configuration positions.

8. The housing device according to claim 1, including a base area, said housing areas being disposed on said base area.

9. The housing device according to claim 8, wherein said base area is substantially flat and is substantially formed in a base plane disposed perpendicularly to said accommodating plane.

10. The housing device according to claim 9, wherein said base area has a cutout connecting an area of at least one of said contact elements.

11. The housing device according to claim 10, wherein:
    said contact elements have a contact area; and
    said cutout connects said contact area.

12. The housing device according to claim 11, wherein said cutout at least one of interlocks, force-fit accommodates, and fixes an area of said contact area.

13. The housing device according to claim 12, wherein said cutout connects said area of said contact area with one of an undersize and a push fit.

14. A contact element for use in a housing device comprising:
    at least one substantially electrically conductive contact area being formed to contact a contact device upon the contact element being received in at least one housing area of the housing device according to claim 1; and
    at least one attachment area attaching the contact element to the at least one housing area when said contact element is accommodated in paid at least one housing area; and
    at least one of said contact area and said attachment area being at least partially complementary to at least one web element of the housing area to hold said at least one of said contact area and said attachment area in at least one of an interlock and a force-fit when the contact element is accommodated in the at least one housing area and to place the contact element in a number of orientations at a configuration position.

15. The contact element according to claim 14, wherein the contact element has a substantially planar contact plate.

16. The contact element according to claim 15, wherein said contact plate is an insert plate.

17. The contact element according to claim 16, wherein said insert plate is said contact area.

18. The contact element according to claim 17, wherein said attachment area is at least one recess in said contact plate.

19. The contact element according to claim 18, wherein:
    said contact plate has an edge and a central area; and
    said recess is formed in at least one of said edge and said central area.

20. The contact element according to claim 19, wherein:
    said contact plate has at least one of a size and a shape to rest at least in an area between two adjacent configuration positions when the contact element is accommodated in the at least one housing area; and
    said contact plate surrounds said at least one web element.

21. The contact element according to claim 20, wherein said contact plate surrounds said at least one web element with said recess.

22. The contact element according to claim 19, wherein said contact plate has at least one of a size and a shape to rest substantially between two of said web elements when said contact element is accommodate in said at least one housing area.

23. The contact element according to claim 14, wherein;
    the at least one housing area has a push fit; and
    said attachment area is an area able to engage with said push fit when the contact element is accommodated in the at least one housing area.

24. The contact element according to claim 23, wherein said attachment area has a size and a shape and engages with said push fit when said contact element is accommodated in the at least one housing area based upon at least one of said size and said shape.

25. The contact element according to claim 24, wherein said attachment area is an area of said contact plate.

26. The contact element according to claim 15, wherein said contact area includes a substantially electrically conductive tap area for tapping off at least one of an electrical potential and a current.

27. The contact element according to claim 26, wherein said tap area extends substantially at right angles to said contact plate.

28. The contact element according to claim 27, wherein said tap area is substantially plate-shaped.

29. The contact element according to claim 28, wherein:
at least one of said web elements in the at least one housing area has grooves; and
said tap area has edge areas engageable in at least one of an interlock and a force-fit with said grooves when said contact element is accommodated in the at least one housing area.

* * * * *